(12) United States Patent
Lee

(10) Patent No.: US 7,230,865 B2
(45) Date of Patent: Jun. 12, 2007

(54) INPUT/OUTPUT LINE SHARING APPARATUS OF SEMICONDUCTOR MEMORY DEVICE

(75) Inventor: Joong Ho Lee, Chungcheongbuk-do (KR)

(73) Assignee: Hynix Semiconductors, Inc., Icheon-si, Gyeonggi-do (KR)

( * ) Notice: Subject to any disclaimer, the term of this patent is extended or adjusted under 35 U.S.C. 154(b) by 29 days.

(21) Appl. No.: 11/321,518

(22) Filed: Dec. 30, 2005

(65) Prior Publication Data
US 2006/0268637 A1 Nov. 30, 2006

(30) Foreign Application Priority Data
May 31, 2005 (KR) .................. 10-2005-0046288

(51) Int. Cl.
*G11C 7/00* (2006.01)
(52) U.S. Cl. .................. 365/201; 365/189.02
(58) Field of Classification Search ............... 365/201, 365/189.02, 189.05
See application file for complete search history.

(56) References Cited

U.S. PATENT DOCUMENTS

| | | | |
|---|---|---|---|
| 5,404,055 A * | 4/1995 | Shankar et al. | 326/41 |
| 6,061,290 A * | 5/2000 | Shirley | 365/230.02 |
| 6,294,925 B1 * | 9/2001 | Chan et al. | 326/37 |
| 6,498,755 B2 * | 12/2002 | Takahashi et al. | 365/189.07 |

* cited by examiner

*Primary Examiner*—Michael Tran
(74) *Attorney, Agent, or Firm*—Johnny Kumar; Justin Darrow; Heller Ehrman, LLP

(57) ABSTRACT

Provided is an input/output line sharing apparatus of a semiconductor memory device. In this apparatus, a global input/output line is shared by a data line signal and a test mode signal, and an input/output line between test mode signals is shared. The apparatus comprises a global input/output line, a first control signal generating unit configured to generate a test mode control signal from a test mode register set signal, a multiplexer configured to output a signal selected from a data line signal and a test mode signal to the global input/output line in response to the test mode control signal, and a latch unit configured to store the test mode signal outputted from the global input/output line in response to the test mode control signal.

8 Claims, 6 Drawing Sheets

INPUT/OUTPUT LINE SHARING APPARATUS OF SEMICONDUCTOR MEMORY DEVICE

BACKGROUND OF THE INVENTION

1. Field of the Invention

The present invention generally relates to an input/output line sharing apparatus of a semiconductor memory device, and more specifically, to an input/output line sharing apparatus of a semiconductor memory device wherein a data line signal and a test mode signal share a global input/output line, and an input/output line is shared between test mode signals.

2. Description of the Related Art

A global input/output line in a memory device is an important factor to determine the area of peripheral circuits.

Referring to FIG. 1, the number of global input/output lines in a DRAM is shown.

The number of global input/output lines is determined depending on an internal prefetch structure. If 16 input/output lines are required in a X16 structure of a SDRAM, a DDR1 that has a 2 bit prefetch structure requires 32 input/output lines, a DDR2 that has a 4 bit prefetch structure requires 64 input/output lines and a DDR3 that has a 8 bit prefetch structure requires 128 input/output lines.

In other words, the area of the global input/output lines is increased by twice as the product is changed into the DDR1, DDR2 and DDR3. As a result, the area of peripheral circuit units depends on the number of global input/output lines which increases for high-speed.

In order to improve reliability of a semiconductor device in the DRAM, a test mode operation is required with a normal read/write operation. As a package type of the DRAM becomes FBGA, the number of test mode circuits increases.

However, in the prior art, a data line signal and a test mode signal individually use different input/output lines, so that they require a lot of global input/output lines.

SUMMARY OF THE INVENTION

Various embodiments are directed at providing an input/output line sharing apparatus of a semiconductor memory device wherein a global input/output line is shared by a data line signal and a test mode signal while collision of the data line signal and the test mode signal is prevented, and an input/output line is shared between test mode signals, thereby reducing the number of global input/output lines.

According to one embodiment of the present invention, an input/output line sharing apparatus of a semiconductor memory device comprises a global input/output line, a first control signal generating unit configured to generate a test mode control signal from a test mode register set signal, a multiplexer configured to output a signal selected from a data line signal and a test mode signal to the global input/output line in response to the test mode control signal, and a latch unit configured to store the test mode signal outputted from the global input/output line in response to the test mode control signal.

According to another embodiment of the present invention, an input/output line sharing apparatus of a semiconductor memory device comprises a global input/output line, a first control signal generating unit configured to generate a test mode control signal from a test mode register set signal, a multiplexer configured to output a signal selected from a data line signal and a test mode signal to the global input/output line in response to the test mode control signal, a latch unit configured to store the test mode signal outputted from the global input/output line in response to the test mode control signal, a second control signal generating unit configured to generate a sharing control signal from the test mode register set signal, and a test mode multiplexer configured to output one selected from a test mode signal groups as the test mode signal in response to the sharing control signal.

BRIEF DESCRIPTION OF THE DRAWINGS

Other aspects and advantages of the present invention will become apparent upon reading the following detailed description and upon reference to the drawings in which.

DETAILED DESCRIPTION OF THE EXAMPLARY EMBODIMENTS

The present invention will be described in detail with reference to the accompanying drawings. Wherever possible, the same reference numbers will be used throughout the drawings to refer to the same or like parts.

Figure 1:
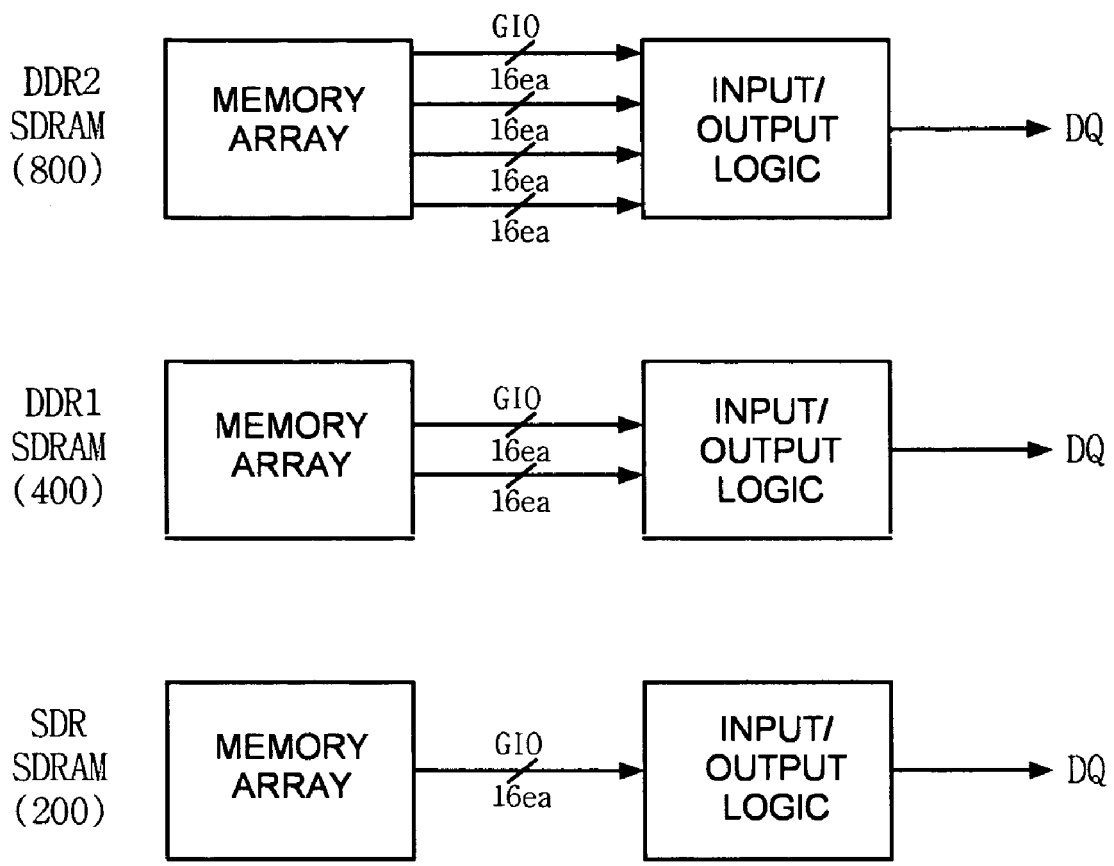
FIG. 1 is a diagram illustrating global input/output lines of a DRAM.
Figure 2:
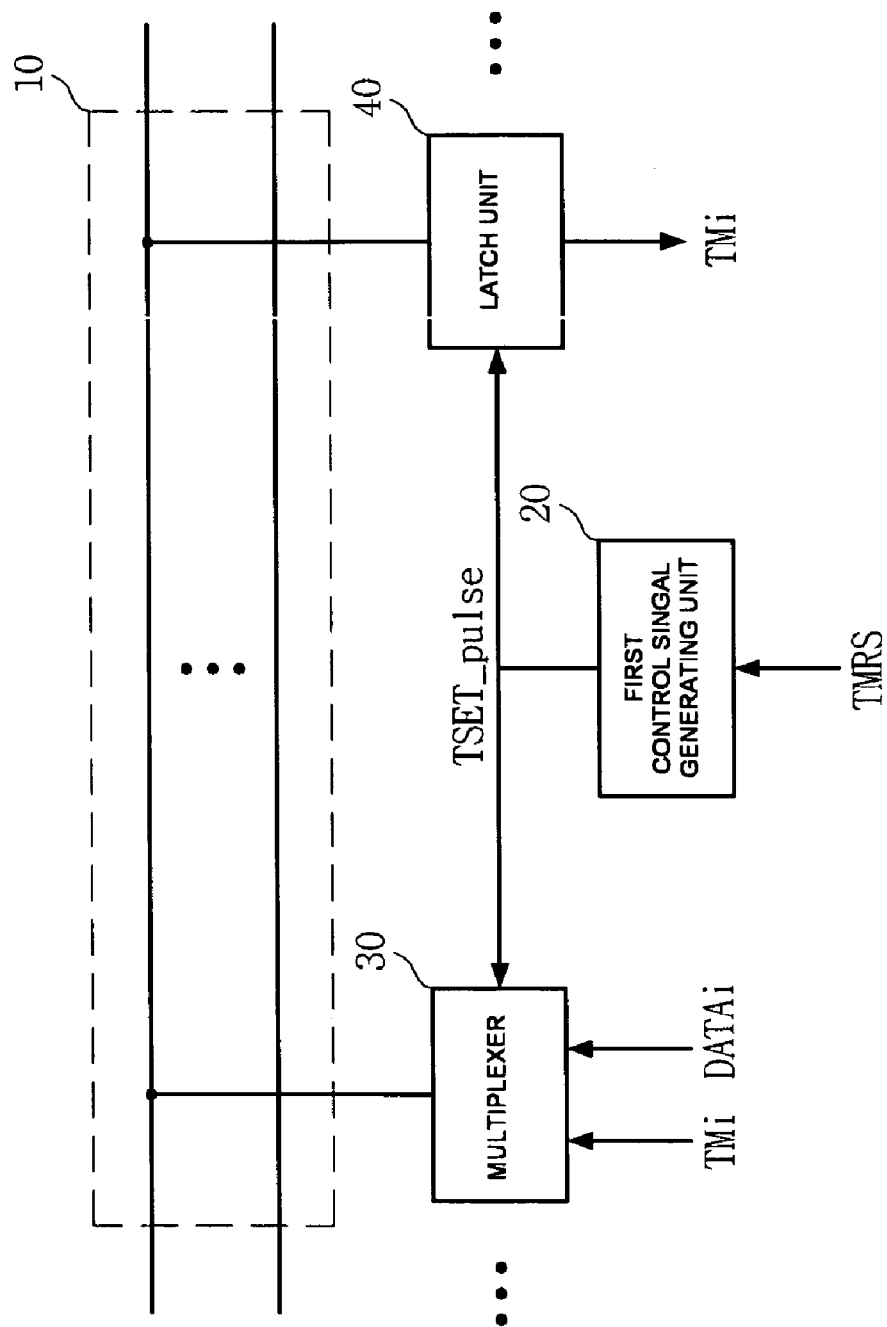
FIG. 2 is a diagram illustrating an input/output line sharing apparatus of a semiconductor memory device that shares a data line signal and a test mode signal according to an embodiment of the present invention.

FIG. 2 is a diagram illustrating an input/output line sharing apparatus of a semiconductor memory device that shares a data line signal and a test mode signal according to an embodiment of the present invention.

Referring to FIG. 2, the input/output line sharing apparatus of a semiconductor memory device comprises a global input/output line 10, a first control signal generating unit 20 configured to generate a test mode control signal TSET_pulse from a test mode register set signal TMRS, a multiplexer 30 configured to output a signal selected from a data line signal DATAi and a test mode signal TMi to the global input/output line 10 in response to the test mode control signal TSET_pulse, and a latch unit 40 configured to store the test mode signal TMi outputted from the global input/output line 10 in response to the test mode control signal TSET_pulse.

The first control signal generating unit 20 generates a test mode set signal TSET from the test mode register set signal TMRS to generate the test mode control signal TSET_pulse which is a pulse signal from the test mode set signal TSET.

The multiplexer 30 outputs the signal selected from the data line signal DATAi and the test mode signal TMi to the global input/output line 10 in response to the test mode control signal TSET_pulse.

The latch unit 40 stores the test mode signal TMi outputted from the global input/output line 10 in response to the test mode control signal TSET_pulse.

Figure 3:
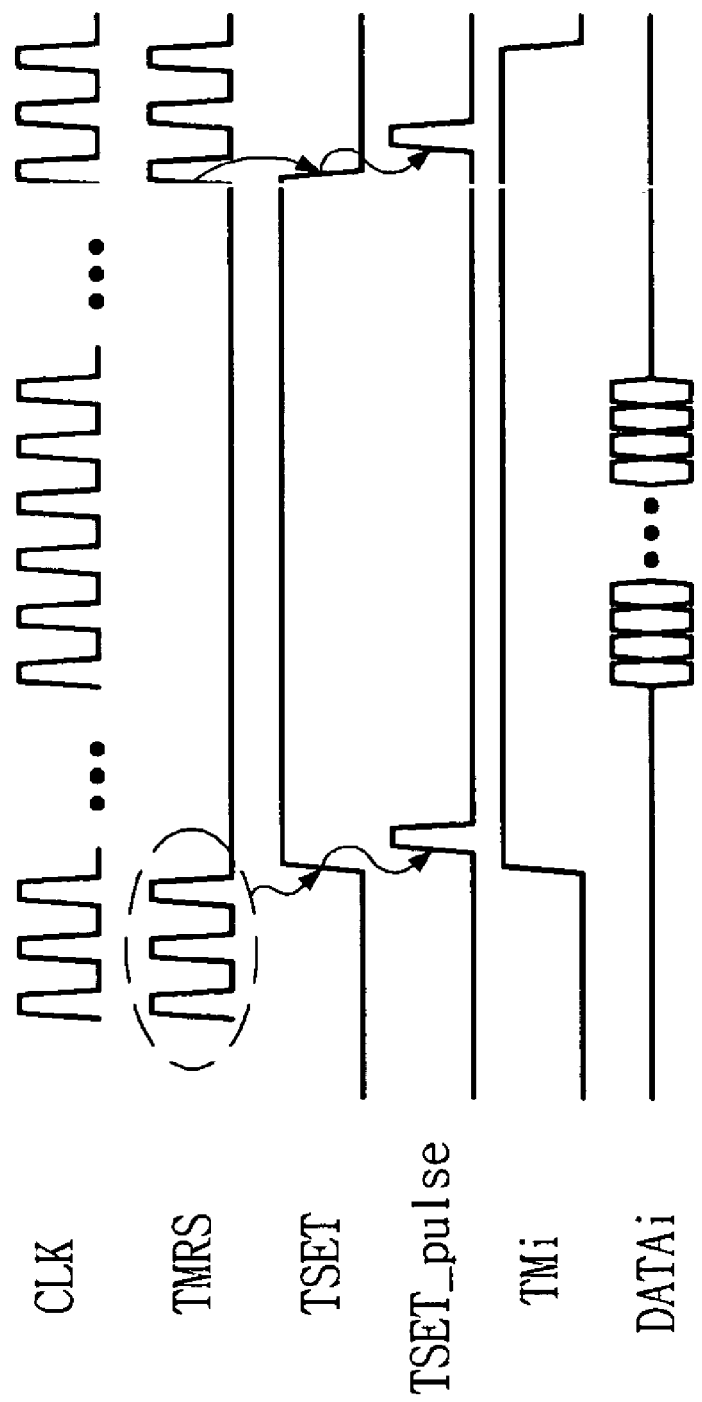
FIG. 3 is a timing diagram illustrating the operation of the input/output line sharing apparatus of the semiconductor memory device of FIG. 2.

FIG. 3 is a timing diagram illustrating the operation of the input/output line sharing apparatus of the semiconductor memory device of FIG. 2.

When a test mode starts, the first control signal generating unit 20 enables the test mode set signal TSET if the test mode register set signal TMRS is three times enabled, and detects a rising edge of the test mode set signal TSET to generate the test mode control signal TSET_pulse which is a pulse signal.

When the test mode control signal TSET_pulse becomes 'high', the test mode signal TMi is outputted into the global input/output line 10 through the multiplexer 30.

When the test mode control signal TSET_pulse becomes 'high', the test mode signal TMi on the global input/output line 10 is transmitted and stored into the latch unit 40.

When the test mode control signal TSET_pulse becomes 'low', the multiplexer 30 outputs the data line signal DATAi into the global input/output line 10 so that data are normally read and written.

When the test mode is finished, the first control signal generating unit 20 disables the test mode set signal TSET if the test mode register set signal TMRS is enabled, and detects a falling edge of the test mode set signal TSET to generate the test mode control signal TSET_pulse which is a pulse signal.

When the test mode control signal TSET_pulse becomes 'low' after the test mode set signal TSET is disabled, the multiplexer 30 disconnects the test mode signal TMi with the global input/output line 10.

At a normal mode, since the test mode control signal TSET_pulse is constantly at the low level, the multiplexer 30 outputs the data line signal DATAi into the global input/output line 10 so that data are read and written.

Figure 4:
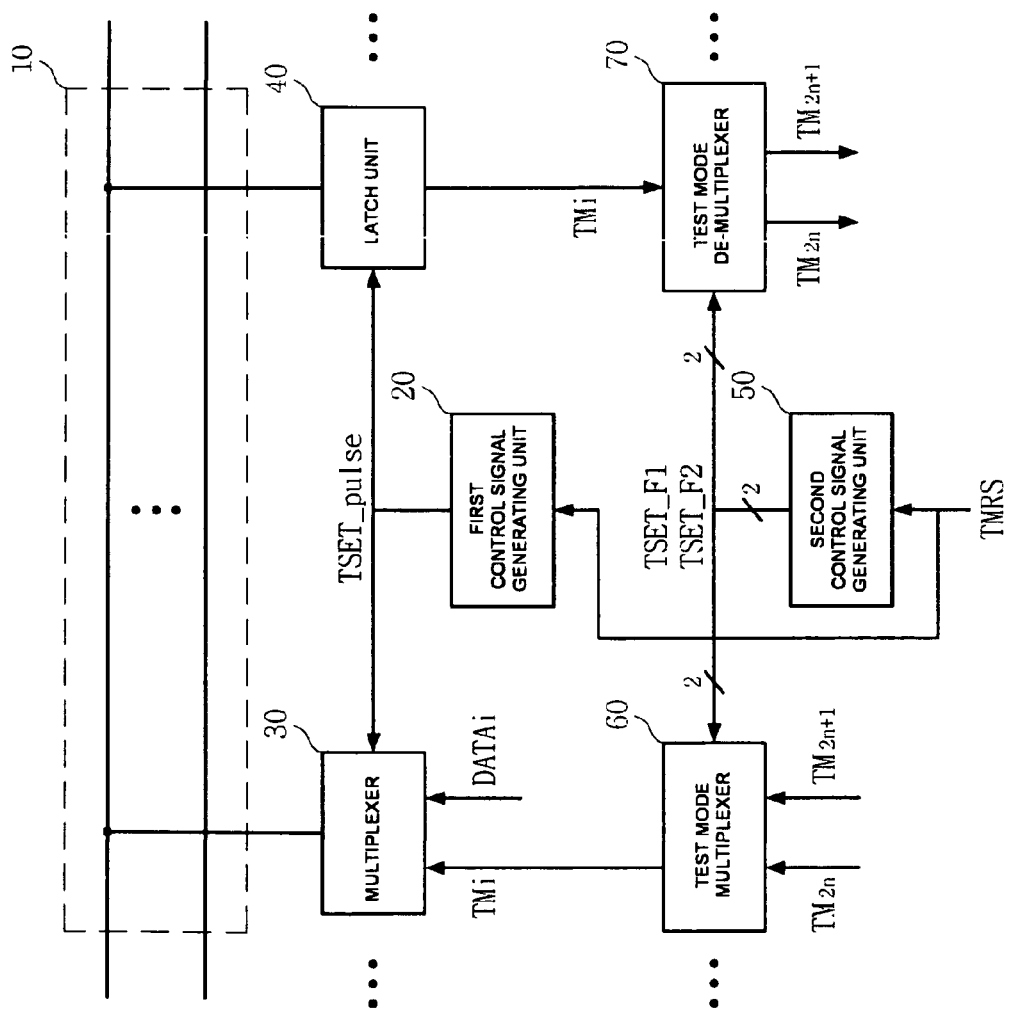
FIG. 4 is a diagram illustrating an input/output line sharing apparatus of a semiconductor memory device that shares an input/output line between test mode signals according to an embodiment of the present invention.

FIG. 4 is a diagram illustrating an input/output line sharing apparatus of a semiconductor memory device that shares an input/output line between test mode signals according to an embodiment of the present invention.

FIG. 4 shows an example when test mode signals are divided into two groups and shared. It can be easily extended when test mode signals are divided into four or more groups.

Referring to FIG. 4, the input/output line sharing apparatus of the semiconductor memory device comprises a global input/output line 10, a first control signal generating unit 20 configured to generate a test mode control signal TSET_pulse from a test mode register set signal TMRS, a multiplexer 30 configured to output a signal selected from a data line signal DATAi and a test mode signal TMi into the global input/output line 10 in response to the test mode control signal TSET_pulse, a latch unit 40 configured to store the test mode signal TMi outputted from the global input/output line 10 in response to the test mode control signal TSET_pulse, a second control signal generating unit 50 configured to generate sharing control signals TSET_F1 and TSET_F2 from the test mode register set signal TMRS, a test mode multiplexer 60 configured to output a signal selected from test mode signal groups $TM_{2n}$ and $TM_{2n+1}$ as the test mode signal TMi in response to the sharing control signals TSET_F1 and TSET_F2, and a test mode de-multiplexer 70 configured to output an output signal from the latch unit 40 as the signal selected from the test mode signal groups $TM_{2n}$ and $TM_{2n+1}$ in response to the sharing control signals TSET_F1 and TSET_F2.

Otherwise, the global input/output line 10, the first control signal generating unit 20, the multiplexer 30 and the latch unit 40 are substantially similar to components described in reference to FIG. 2.

The second control signal generating unit 50 generates the sharing control signals TSET_F1 and TSET_F2 from the test mode register set signal TMRS.

The test mode multiplexer 60 outputs the signal selected from the test mode signal groups $TM_{2n}$ and $TM_{2n+1}$ as the test mode signal TMi in response to the sharing control signals TSET_F1 and TSET_F2.

The test mode de-multiplexer 70 outputs the output signal from the latch unit 40 as the signal selected from the test mode signal groups $TM_{2n}$ and $TM_{2n+1}$ in response to the sharing control signals TSET_F1 and TSET_F2.

Figure 5:
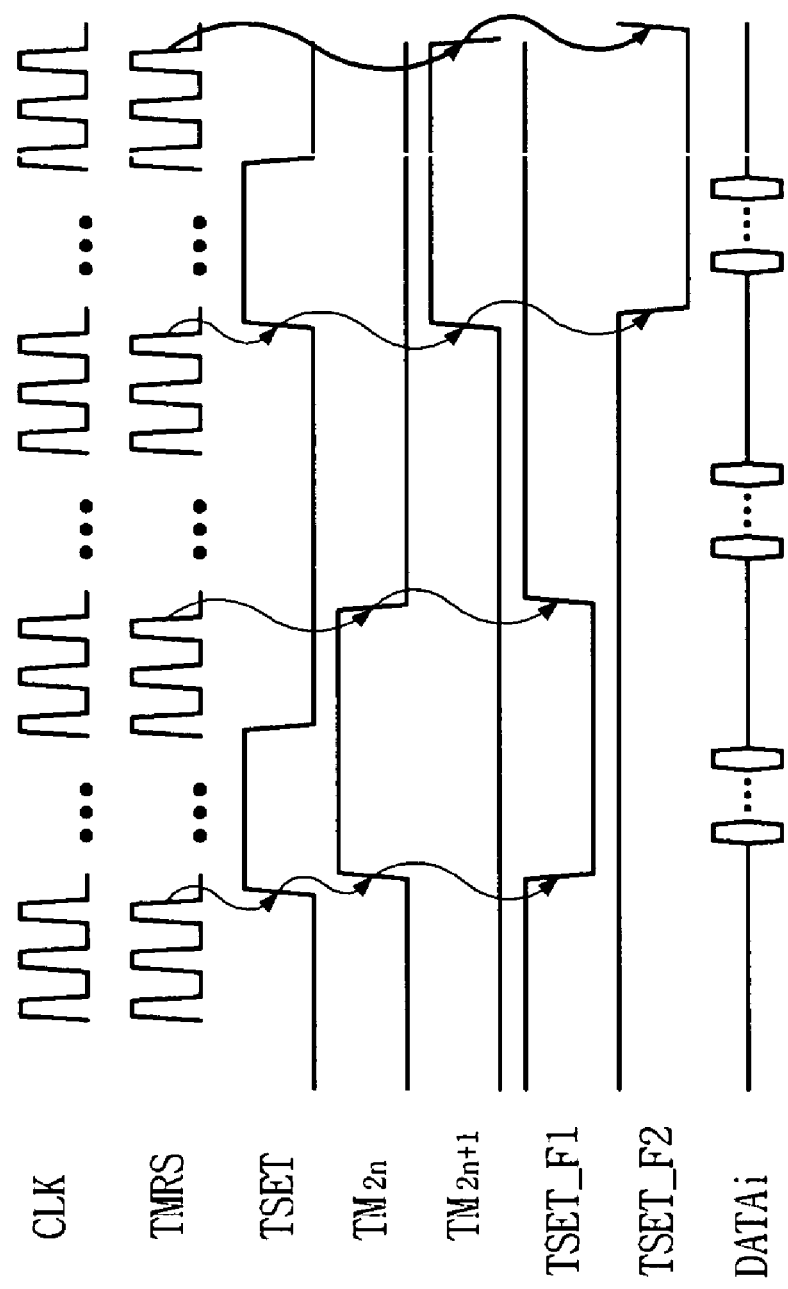
FIG. 5 is a timing diagram illustrating a non-concurrent test mode in the input/output line sharing apparatus of the semiconductor memory device of FIG. 4.
Figure 6:
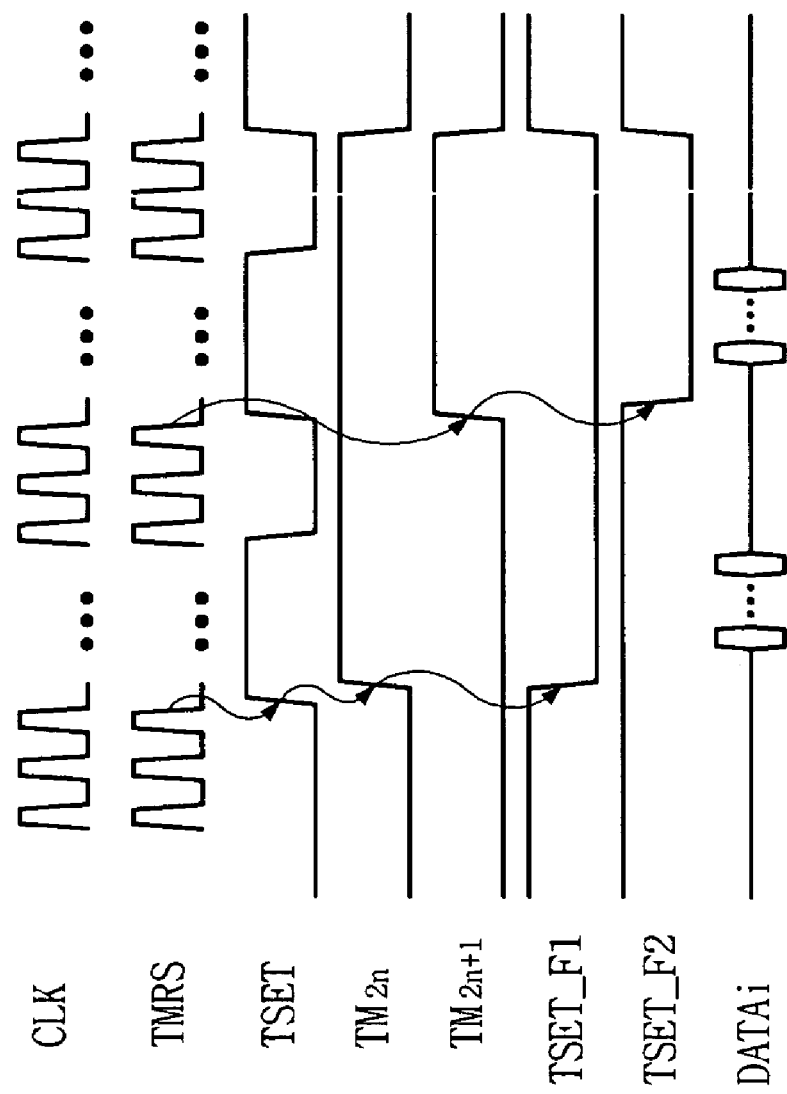
FIG. 6 is a timing diagram illustrating a concurrent test mode in the input/output line sharing apparatus of the semiconductor memory device of FIG. 4.

FIGS. 5 and 6 are timing diagrams illustrating the operation of the input/output line sharing apparatus of the semiconductor memory device of FIG. 4.

For sharing, the whole test mode signals are divided into a desired number of groups.

When 40 test mode signals are divided into two groups, 20 test mode signal lines and 2 control lines are required. As a result, the 40 lines required conventionally are reduced to 22 lines in this embodiment.

When 40 test mode signals are divided into four groups, 10 test mode signal lines and 4 control lines are required. As a result, the 40 lines required conventionally are reduced to 14 lines in this embodiment.

FIG. 5 shows the timing diagram at a non-concurrent test mode. In the non-concurrent test mode, one of shared signals is enabled at one time.

When the test mode to $TM_{2n}$ is entered, if the test mode register set signal TMRS is enabled three times, the test mode set signal TSET is enabled, and the test mode signal $TM_{2n}$ is enabled.

When $TM_{2n}$ is generated, the second control signal generating unit 50 transits the sharing control signal TSET_F1 from 'high' to 'low'. The test mode multiplexer 60 outputs $TM_{2n}$ as the test mode signal TMi in response to the sharing control signal TSET_F1.

The test mode de-multiplexer 70 outputs the test mode signal TMi as $TM_{2n}$ in response to the sharing control signal TSET_F1.

When the test mode to $TM_{2n}$ is finished, the test mode set signal TSET is disabled if the test mode register set signal TMRS is enabled, and the test mode signal $TM_{2n}$ is disabled if the test mode register set signal TMRS is enabled three times.

When $TM_{2n}$ is disabled, the second control signal generating unit 50 transits TSET_F1 from 'low' to 'high'. As a result, $TM_{2n}$ is no longer outputted as the test mode signal TMi.

After the test mode to $TM_{2n}$ is finished, the test mode to $TM_{2n+1}$ can be entered. Here, the procedure to $TM_{2n}$ is repeated except in that the sharing control signal TSET_F2 is used.

FIG. 6 shows the timing diagram at a concurrent test mode. In the concurrent test mode, a couple of shared signals are enabled at one time.

When the test mode to $TM_{2n}$ is entered, if the test mode register set signal TMRS is enabled three times, the test mode set signal TSET is enabled, and the test mode signal $TM_{2n}$ is enabled.

When $TM_{2n}$ is generated, the second control signal generating unit 50 transits the sharing control signal TSET_F1 from 'high' to 'low'. The test mode multiplexer 60 outputs $TM_{2n}$ as the test mode signal TMi in response to the sharing control signal TSET_F1.

When $TM_{2n+1}$ is enabled continuously while $TM_{2n}$ is enabled, the second control signal generating unit 50 transits the sharing control signal TSET_F2 from 'high' to 'low'. The test mode multiplexer 60 outputs $TM_{2n+1}$ as the test mode signal TMi.

When the test mode to $TM_{2n}$ and $TM_{2n+1}$ is finished, the test mode set signal TSET is disabled if the test mode register set signal TMRS is enabled, and the test mode signals $TM_{2n}$ and $TM_{2n+1}$ are disabled if the test mode register set signal TMRS is enabled three times.

When $TM_{2n}$ and $TM_{2n+1}$ are disabled, the second control signal generating unit 50 transits TSET_F1 and TSET_F2 from 'low' to 'high', and the test mode is finished.

As described above, in an input/output line sharing apparatus of a semiconductor memory device according to an embodiment of the present invention, a global input/output line is shared by a data line signal and a test mode signal while collision of the data line signal and the test mode signal is prevented. Also, an input/output line between test mode signals can be shared. As a result, the number of global input/output lines is reduced, thereby decreasing the area of peripheral circuit units.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. An input/output line sharing apparatus of a semiconductor memory device, comprising:
    a global input/output line;
    a first control signal generating unit configured to generate a test mode control signal from a test mode register set signal;
    a multiplexer configured to output a signal selected from a data line signal and a test mode signal to the global input/output line in response to the test mode control signal; and
    a latch unit configured to store the test mode signal outputted from the global input/output line in response to the test mode control signal.

2. The input/output line sharing apparatus according to claim 1, wherein when a test mode starts, the first control signal generating unit enables a test mode set signal if the test mode register set signal is three times enabled, and detects a rising edge of the test mode set signal to generate the test mode control signal which is a pulse signal.

3. The input/output line sharing apparatus according to claim 1, wherein when a test mode is finished, the first control signal generating unit disables a test mode set signal if the test mode register set signal is enabled, and detects a falling edge of the test mode set signal to generate the test mode control signal.

4. An input/output line sharing apparatus of a semiconductor memory device, comprising:
    a global input/output line;
    a first control signal generating unit configured to generate a test mode control signal from a test mode register set signal;
    a multiplexer configured to output a signal selected from a data line signal and a test mode signal to the global input/output line in response to the test mode control signal;
    a latch unit configured to store the test mode signal outputted from the global input/output line in response to the test mode control signal;
    a second control signal generating unit configured to generate a sharing control signal from the test mode register set signal; and
    a test mode multiplexer configured to output a signal selected from test mode signal groups as the test mode signal in response to the sharing control signal.

5. The input/output line sharing apparatus according to claim 4, further comprising a test mode de-multiplexer configured to output an output signal from the latch unit as the signal selected from the test mode signal groups in response to the sharing control signal.

6. The input/output line sharing apparatus according to claim 5, wherein the test mode multiplexer outputs the signal selected from two test mode signals as the test mode signal, the test mode de-multiplexer outputs the output signal from the latch unit as one selected from the two test mode signals, and the sharing control signals include a first sharing control signal and a second sharing control signal.

7. The input/output line sharing apparatus according to claim 4, wherein when a test mode starts, the first control signal generating unit enables a test mode set signal if the test mode register set signal is three times enabled, and detects a rising edge of the test mode set signal to generate the test mode control signal which is a pulse signal.

8. The input/output line sharing apparatus according to claim 4, wherein when a test mode is finished, the first control signal generating unit disables a test mode set signal if the test mode register set signal is enabled, and detects a falling edge of the test mode set signal to generate the test mode control signal.

* * * * *